United States Patent [19]

Rose et al.

[11] Patent Number: 4,896,036

[45] Date of Patent: Jan. 23, 1990

[54] DETECTOR OBJECTIVE FOR SCANNING MICROSCOPES

[75] Inventors: Harald Rose; Joachim Zach, both of Darmstadt, Fed. Rep. of Germany

[73] Assignee: Siemens Aktiengesellschaft, Berlin and Munich, Fed. Rep. of Germany

[21] Appl. No.: 150,245

[22] Filed: Jan. 29, 1988

[30] Foreign Application Priority Data

Feb. 2, 1987 [DE] Fed. Rep. of Germany ....... 3703029

[51] Int. Cl.$^4$ ........................................... H01J 37/244
[52] U.S. Cl. .................................... 250/310; 250/397; 250/396 R
[58] Field of Search ................... 250/310, 311, 356 R, 250/396 R, 357

[56] References Cited

U.S. PATENT DOCUMENTS

| | | | |
|---|---|---|---|
| 3,714,425 | 1/1973 | Someya et al. | 250/310 |
| 3,845,305 | 10/1974 | Liebl | 250/310 |
| 4,214,162 | 7/1980 | Hoppe et al. | 250/311 |
| 4,303,864 | 12/1981 | Crewe | 250/396 R |
| 4,414,474 | 11/1983 | Crewe | 250/311 |
| 4,551,625 | 11/1985 | Lischke et al. | 250/356 R |
| 4,587,425 | 5/1986 | Plows | 250/397 |
| 4,590,379 | 5/1986 | Martin | 250/396 R |
| 4,658,137 | 4/1987 | Garth et al. | 250/310 |
| 4,728,790 | 3/1988 | Plies | 250/310 |
| 4,831,266 | 5/1989 | Frosien et al. | 250/310 |

OTHER PUBLICATIONS

Publication by Von H. Rose, "Elektronenoptische Aplanate", Optik 34 Heft 3, 1971, pp. 285–311.
Publication by H. Koops "Aberration Correction in Electron Microscopy", vol. 3, 1978, pp. 185–196.
Publication by W. Hofker, "Halbleiterdetektoren Fur inoisierende St rahlung," pp. 323–337, 1966, Nr. 12.

*Primary Examiner*—Jack I. Berman
*Attorney, Agent, or Firm*—Hill, Van Santen, Steadman & Simpson

[57] ABSTRACT

In a high resolution imaging system for close inspection of sub-micrometer structures, a scanning electron microscope includes a detector objective essentially composed of an immersion lens and an annular detector which is arranged between a source side electrode lying at a positive potential and a middle electrode of the immersion lens which likewise lies at a variable positive potential and is arranged concentrically relative to a beam axis of a scanning microscope. The middle electrode and the source side electrode are preferably formed as truncated cones. The two-stage deflection element for positioning the primary electron beam on the specimen is preferably integrated into the source side electrode of the immersion lens, the source side electrode being composed of an annular diaphragm and a hollow cylinder.

21 Claims, 3 Drawing Sheets

DETECTOR OBJECTIVE FOR SCANNING MICROSCOPES

BACKGROUND OF THE INVENTION

1. Field of the Invention

The present invention is related generally to a detector objective for use in scanning microscopes.

2. Description of the Related Art

The electrical properties of modern, integrated micro-electronic and opto-electronic components are critically influenced by the geometrical dimensions of their sub-structures. It is therefore particularly important to observe close dimensional tolerances as an indispensable prerequisite to the manufacture of functional components with constant physical-electrical properties, particularly when the geometrical dimensions of the structures being generated by modern lithography methods are in the micrometer and sub-micrometer range.

There is, therefore, an increasing need for high resolution imaging systems that enable process proximate inspection and exact measurement of the structures generated in all phases of development and manufacturing of integrated micro electronic and opto-electronic components. Scanning electron microscopes have proven especially suitable for these purposes. Micrometer and sub-micrometer structures are capable of being visually evaluated through the use of scanning electron microsocopes, and errors and deviations from the desired patterns are capable of being identified. Topographical data such as lengths, widths, heights or angles of inclination of the structures are capable of being acquired and interpreted with scanning electron microscopes. It must thereby be assured during all examinations of electrical components using scanning electron microscopes that modifications of the substrate, such as occur, for example, due to contamination and radiation damage, are avoided.

Conventional scanning electron microscopes achieve a resolution of a few nanometers only at high accelerating voltages of above approximately 20 kv. Resist structures as well as the circuits are damaged due to such high energy electrons, and non-conductive and/or poorly conductive surface regions of the specimen under examination are electrically charged. It is a standard practice in scanning electron microscopy to metalize the specimen to supress these charges. However, such metalization deteriorates the resolution and the image quality so that it is not suitable for examination of such small microelectronic and opto-electronic components. Furthermore, their function is destroyed or modified in an inadmissible way by the application of a metal layer.

SUMMARY OF THE INVENTION

An object of the present invention is to provide a detector objective in which the resolution and the detector efficiency of a scanning microscope is noticably increased at low primary energies. This and other objects are inventively achieved by a detector objective having an immersion lens including a middle electrode and a detector, where the middle electrode and the detector are disposed within the immersion lens and concentric by about the beam axis for documenting secondary and/or backscattered particles. The invention is particularly applicable for scanning electron microscopes.

An advantage obtainable with the invention is, in particular, that particle probes having small cross sections can be generated at low primary energies. Moreover, high resolution and nearly charge-free examination of non-conductive and poorly conductive specimens are guaranteed. Preferred developments and improvements of the invention includes providing a source side electrode in the immersion lens at a first potential and providing a second positive potential at the middle electrode, the second potential being higher than the first potential at the source side electrode. A particle accelerating electrode at a third potential may also be provided. The specimen side electrode may be at a potential equal to that of the specimen and, in a further embodiment, both the specimen side electrode and middle electrode are formed as truncated cones. The conical surface of these electrodes preferably describes an angle of between 30 and 70 degrees relative to the beam axis.

The source side electrode can include an annular part disposed symmetrically about the beam axis and a hollow cylinder disposed in a central bore of the annular part. The detector of one embodiment is annular in shaped and disposed between the source side electrode and the middle electrode. A deflection element for deflecting the primary particle beam can be integrated into the source side electrode. The source side electrode of one development includes a hollow cylinder divided into upper and lower parts along a plane perpendicular to the beam axis, wherein each of the upper and lower parts is composed of at least four segments and possibly as many as eight segments.

BRIEF DESCRIPTION OF THE DRAWINGS

FIG. 3b is a plan view of the detector objective of FIG. 3a.

DESCRIPTION OF THE PREFERRED EMBODIMENTS

Figure 1:
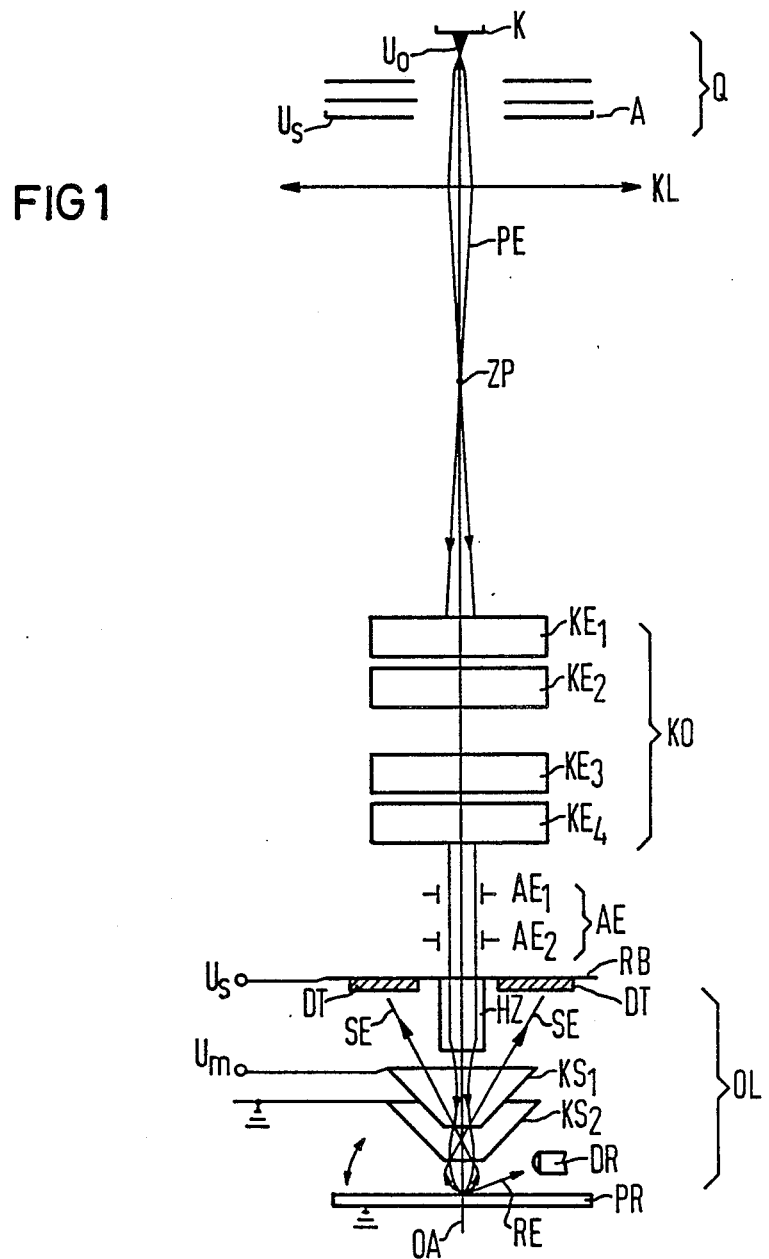
FIG. 1 is a schematic diagram of a scanning electron microscope including a detector objective according to the principles of the present invention.

A scanning electron microscope is shown schematically in FIG. 1 and is essentially composed of an electron beam generator preferrably in the form of a field emission source Q, a condensor lens KL for focusing primary electrons PE emitted by a cathode K and accelerated in the direction of an anode A at a potential $U_s$ into an intermediate image of source image ZP of the electron source lying on a beam axis OA. A lens system or corrector KO including at least four octopole or 12 pole elements $KE_1$ through $KE_4$ for correcting spherical and chromatic aberrations of the imaging lens is provided, as well as a two-stage deflection element AE arranged in the beam path immediately behind the corrector unit KO and formed by two cylindrical or plate-shaped structures $AE_1$ and $AE_2$ driven by signal generators (not shown). An electrostatic objective lens OL is provided for demagnified imaging of the intermediate image ZP of the source onto a specimen PR that is arranged on a mount immediately under the objective lens OL. An immersion lens having a middle electrode $KS_1$ is inventively provided as the objective lens OL. The electrode of the objective lens OL at the source side lies at the anode potential $U_S$ comprises an annular diaphram RB having a hollow cylinder HZ arranged concentrically about to the beam axis OA. The hollow cylinder HZ extends in the direction of the specimen PR.

In accordance with the invention, the middle electrode $KS_1$ is charged with a variable positive potential $U_M$, where $U_M$ is greater than $U_S$. Another electrode $KS_2$ of the immersion lens OL arranged at the specimen side lies at the same potential as that of the specimen PR. Here, both the specimen PR and second electrode $KS_2$ are at ground. The electrodes $KS_1$ and $KS_2$ act as control electrodes and are each formed in the shape of a truncated cone. The electrodes $KS_1$ and $KS_2$ are arranged concentrically relative to the beam axis OA. To be able to examine an image of the specimen PR in an inclined condition, the lateral faces of the electrodes $KS_1$ and $KS_2$ are tapered in the direction of the specimen PR, preferably describing an angle $\alpha$ (shown in FIG. 3a) with the beam axis OA, where $\alpha$ lies between approximately 30 and 70 degrees, inclusive.

In the illustrated exemplary embodiment, a detector DT for documenting secondary electrones SE triggered in and on the specimen PR by the primary electrons PE is disposed within the immersion lens OL between the electrode RB/HZ at the source side and the middle electrode $KS_1$. The detector DT is arranged concentrically relative to the beam axis OA. It is preferably composed of an annular, electron-sensitive part which is held in insulated fashion about the central bore of the hollow cylinder HZ of the source side electrode RB of the immersion lens OL.

To achieve different contrasts, it is expedient to divide the detector DT into a plurality of segments and to combine the signals generated in these segments in the desired way. For example, a difference calculation of signals generated in two half-ring portions of the detectors, or suppression of one of those two signals may be performed. Since the hollow cylinder HZ lies at a somewhat lower, positive potential $U_S$ than the middle electrode $KS_1$ ($U_M$ is greater than $U_S$) of the immersion lens OL, it is the secondary electrons SE moving at small angles relative to the beam axis OA which are deflected in the direction of the detector DT and are documented. The hollow cylinder HZ serves to shield the primary electron beam from the high voltage off, for example, +10 kV applied to the detector DT for accelerating the secondary particles SE.

Semiconductor detectors are known, for example, from the publication by W. K. Hofkar, Philips Technische Rundschau, No. 12, 1966, pages 232 through 337. Such detectors particularly come into consideration as the detector DT. Their particle sensitive regions are potentially constructed in segmented fashion and are formed as metal-semiconductor or p-n junction detectors. Of course, scintillator lightguide combinations or channel plates can also be used as secondary electron detectors. In comparison to other detector configurations, however, annular detectors have the advantage that nearly all secondary electrons SE extracted from the specimen PR in the rotationally symmetrical electrical field of the immersion lens OL can be acquired and documented.

The lens system KO, referred to as the corrector lens and composed of at least four 8-pole or 12-pole elements $KE_1$ through $KE_4$, is generally known from the publication by H. Rose, "Elektronenoptische Aplanate", Optik 34, No. 3, 1971, pages 285 thru 311 (see in particular, page 308, FIG. 9), and of H. Koops "Aberration Correction in Electron Microscopy", 9th International Congress on Electron Microscopy, Volume 3, Toronto 1978, Volume 3, pages 184 thru 196 (see in particular, page 191, FIG. 4).

Figure 2:
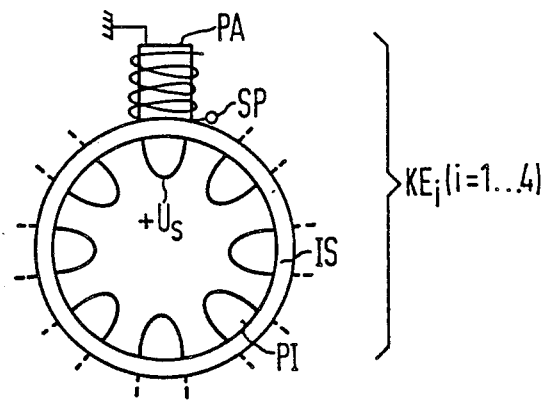
FIG. 2 is a plan view of an octopole element of the lens system shown in FIG. 1 for correction of spherical and chromatic aberrations of the detector objective.

The lens system arranged in the beam path immediately above the two-stage deflection element AE serves to correct the spherical and chromatic aberrations of the detector objective OL. One of the 8-pole elements $KE_i$ (where i=1 thru 4) of the detector KO is schematically shown in FIG. 2. The element $KE_i$ is composed of 8 inner pole shoes PI lying at anode potential $U_S$, which are separated from outer pole shoes PA (only one of which is shown for the sake of simplicity) lying at ground potential. Each outer pole shoe PA is surrounded by an excitation coil SP and is separated from the inner pole shoes PI by a cylindrical insulator IS. Each of the elements $KE_1$ generates magnetic quadrupole and octopole fields for correcting the spherical aberration of the detector objective OL. Electrical quadrupole fields are used for correcting the chromatic aberration, these fields being built up with the assistance of an auxiliary potential applied to the inner electrodes PI of the middle multipole elements $KE_2$ and $KE_3$ of the corrector lens KO.

The deflecting element $AE_1$ at the source side can be eliminated when electrical dipole fields for preliminary deflection of the primary electron beam PE are additionally generated inside the corrector element $KE_4$. Such dipole fields, as well as every other electrical field or potenial, are of course generated by connecting the respective elements to an electrical signal source.

The four 8-pole or 12-pole elements $KE_1$ thru $KE_4$ are sufficient for correcting the spherical and chromatic aberrations of the detector objective OL. The use of five elements, however, offers the additional possibility of correcting extra-axial aberrations of the objective lens. Such imaging errors, however, are negligibly small in scanning electron microscopes having a two-stage deflection element AE, so that a fifth corrector element can be foregone.

Since spherical aberrations of the third order are correctable with the octopole elements $KE_1$ thru $KE_4$, spherical aberrations of the fifth order which increase with the distance between the corrector KO and the detector objective OL limit the resolution. Their influence can be considerably reduced by using 12 pole elements in the corrector KO without deterioration of the corrections of lower orders.

Figure 3A:
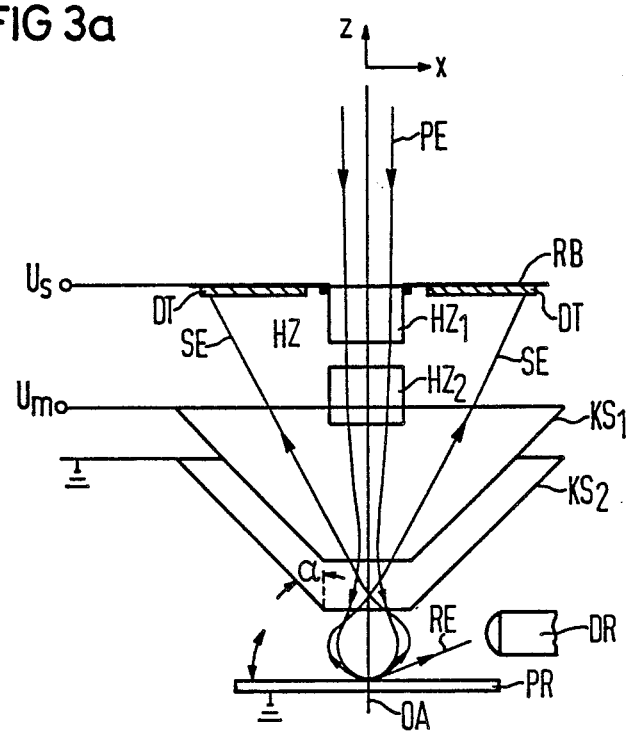
FIG. 3a is a schematic diagram of a detector objective of the invention including an integrated deflection element.
Figure 3B:
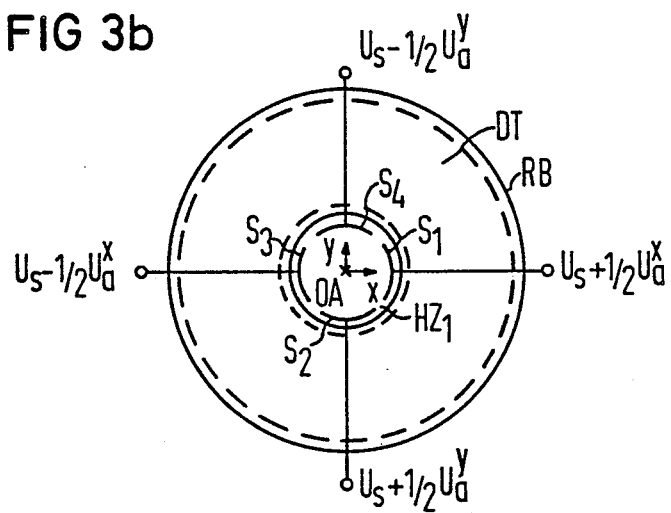

For further reduction of spherical aberrations of the fifth order which increase with the distance between the corrector KO and the immersion lens OL, the two-stage deflection element AE as shown schematically in FIGS. 3a and 3b is integrated into the source side electrode of the detector objective OL. The hollow cylinder HZ is arranged in insulated fashion within the annular diaphram RB and the cylinder HZ is divided in a plane perpendicular to the beam axis OA to form an upper cylinder part $HZ_1$ and a lower cylinder part $HZ_2$. Each of the cylinder parts $HZ_1$ and $HZ_2$ are in turn divided into four or eight sectors $S_1$ thru $S_4$ as shown in FIG. 3b. To position the primary electron beam PE on the specimen PR or, for line-by-line sweeping thereof, the segments S1 thru S4 lie at the anode and by the axial chromatic aberration of the imaging lens. As a consequence of the Coulomb repulsion (also referred to as the lateral Boersch effect) between the electrons which acts along the entire beam path between the source and the specimen, the probe diameter increases. Moreover, the interaction between the electrons in regions of high current densities, and in particular in the electron beam generator Q and at the beam crossovers (see for example ZP in FIG. 1), leads to a spread of the energy distribution of the primary electrons PE. This in turn leads to an enlargement of the probe diameter indirectly through the chromatic aberration of the objective lens. The known relationship $$d=(d_O^2+d_F^2)^{\frac{1}{2}}$$

is thus valid for probe diameters d on the specimen which determines the resolution, where $d_o$ indicates the geometric-optic probe diameter expanded by the Coulomb repulsion of the electrons PE between the generator Q and the specimen PR, i.e. the influence of the lateral Boersch effect. And $d_F$ indicates the diameter of the chromatic aberration disk generated by the chromatic aberration of the imaging lens. The quantity $d_F$ is in turn defined by the relationship $$d_F=2C_F\cdot\beta\cdot\Delta U/U,$$

where $C_F$ indicates the chromatic aberration constant of the imaging lens, $\beta$ indicates the beam aperture, eU indicates the primary energy (for U=the accelerating voltage and e=the electron charge), and $e\Delta U$ indicates the width of the energy distribution of the electrons. Further improvements in the resolution of the scanning electron microscope shown in FIG. 1 are therefore particularly achieved by reducing the lateral and potential $U_S$ and are further charged with suitable auxiliary potentials $U^x{}_a$ or $U^y{}_a$ for deflection in the x direction and y direction, respectively.

A further advantage of integrating the deflection element into the detector objective is that greater deflection angles can be set, and, thus, larger surface regions of the specimen PR can be scanned. This is true because of the smaller distance between the deflecting element and the lens field. Since the primary electron beam PE is tilted around what is referred to as the coma-free point of the objective lens OL in two-stage deflection elements for all deflecting angles, the off-axial aberrations occurring in a single-stage deflection element are avoided. Such off-axial aberrations are due to the off-axial lens traversal of the beam.

It is known that the charge status of the surface region scanned by an electron beam changes when the quantity s, (where s=the yield of emitted electrons=-the mean number of secondary electrons SE and backscattered electrons RE triggered per incident primary electron PE) which defines the charging process differs from one. Charge-free examination of non-conductive and/or poorly conductive specimens using a scanning electron microscope is, therefore, only possible when the energy $E_{PE}$ of the primary electrons PE coincide with the neutral point energy $E_{NP}$ dependent upon the specimen material ($E_{NP}\approx E_{PE}=>s(E_{PE})\approx 1$).

Since, with few exceptions, the neutral point energy $E_{NP}$ lies in the energy range of between about 0.5 and 4 keV, conventional scanning electron microscopes must be operated with low accelerating voltages. Under such operating conditions, however, the smallest possible probe diameter obtainable at the specimen is essentially limited by the Boersch effect energetic Boersch effect in the electron optical column.

Detector objectives according to the present invention are preferably used in low voltage scanning electron microscopes in which the Boersch effect limits the resolution for low particle energies and high beam currents. Since the influence of the lateral Boersch effect decreases with increased kinetic or primary energy eU, but the width of the energy distribution $e\Delta U$ of the primary electrons noticeably increases as a consequence of the energetic Boersch effect, the electrons preferably traverse the first beam crossover point ZP with low energy (a low relative energy width $e\Delta U/eU$) and subsequently are accelerated to high energies. The electrons are decelerated to the desired low ultimate energies shortly before they reach the specimen. The increased kinetic energy shortens the running time of the electrons between the source Q and the specimen PR. To minimize the disadvantageous influence of the Boersch effect on the probe diameter in a scanning electron microscope of FIG. 1 for ultimate electron energies of between 0.2 and 5 keV, the electrodes of the beam generator K and A and of the objective lens OL are for example, charged with the following voltages:

| Electron beam generator Q | |
|---|---|
| Cathode K | $U_o = -0.2$ thru $-5$ kV |
| Anode A | $U_s = +10$ thru $+30$ kV |
| Detector objective OL | |
| Source-side electrode HZ/RB | $U_{HZ} = U_{RB} = U_s$ |
| Middle electrode $KS_1$ | $U_{KS1} = 1.1\ U_s$ thru $2.5\ U_s$ |
| Specimen-side electrode $KS_2$ | $U_{KS2} = 0$ V (ground) |
| Specimen PR | $U_{PR} = 0$ V (ground) |

The invention, of course, is not limited to the exemplary embodiments shown in the Figures and described in the specification. Thus, it is definitely not necessary to place the electrodes $KS_2$ of the detector objective OL and the specimen PR at the same potential. Of course, the primary electrons PE can also be accelerated to high kinetic energies only outside of the beam generator Q. In this case, the source side electrode RB and HZ of the detector objective OL preferably lies at a potential of the electrode arrangement accelerating the primary electrons PE.

For documenting backscattered electrons RE, the detector objective can also be equiped with a second detector DR, as shown in FIG. 1. For example, the detector DR is arranged laterally above the specimen PR. However, it can also be arranged within the detector objective instead of the secondary electron detector DT. Of course, ions, or other charged particles can also, for example, be taken into consideration as the primary and/or secondary particles.

Although other modifications and changes may be suggested by those skilled in the art, it is the intention of the inventors to embody within the patent warranted hereon all changes and modifications as reasonably and properly come within the scope of their contribution to the art.

We claim:

1. An electrostatic detector objective for focusing a primary particle beam guided along a beam axis onto a specimen, comprising:
   an immersion lens including a middle electrode and a detector, said middle electrode and said detector being disposed within said immersion lens and concentric relative to the beam axis for documenting secondary and/or backscattered particles;

a source side electrode included in said immersion lens;

means for providing a first positive potential at said source side electrode; and means for providing a second positive potential at said middle electrode, said second potential being higher than said first potential.

2. An electrostatic detector objective as claimed in claim 1, wherein the scanning microscope has a particle accelerating electrode, and means for providing a potential at said particle accelerating electrode substantially equal to said first potential.

3. An electrostatic detector objective as claimed in claim 1, further comprising:

a specimen side electrode included in said immersion lens; and means for applying a potential to said specimen side electrode substantially equal to a potential of the specimen.

4. An electrostatic detector objective as claimed in claim 1, further comprising:

a specimen side electrode formed as a truncated cone; and said middle electrode being formed as a truncated cone.

5. An electrostatic detector objective as claimed in claim 4, wherein a conical surface of said specimen side electrode and a conical surface of said middle electrode each describe an angle of between 30 and 70 degrees inclusive relative to the beam axis of the scanning microscope.

6. An electrostatic objective as claimed in claim 1, further comprising:

a source side electrode of said immersion lens, said source side electrode including an annular part disposed symmetrically relative to the beam axis and a hollow cylinder disposed in a central opening of said annular part, said hollow cylinder extending in a beam direction from said annular part.

7. An electrostatic detector objective as claimed in claim 1, further comprising:

a source side electrode; and said detector being annular in shape and being disposed between said source side electrode and said middle electrode.

8. An electrostatic detector objective as claimed in claim 1, further comprising:

a source side electrode included in said immersion lens, a deflection element integrated in said source side electrode, said deflection element positioning the primary particle beam.

9. An electrostatic detector objective as claimed in claim 8, wherein said source side electrode includes a hollow cylinder mounted in insulating fashion, said hollow cylinder being divided into upper and lower parts along a plane perpendicular to the beam axis, each of said upper and lower parts of said hollow cylinder being composed of at least four segments.

10. An electrostatic detector objective as claimed in claim 9, wherein each of said upper and lower parts of said hollow cylinder is composed of eight segments.

11. A particle beam device, comprising:

a beam generator for generating primary particles;

a first lens system for focusing the primary particles into a particle beam;

a second, electrostatic, lens system for focusing the particle beam onto a specimen, said second, electrostatic, lens system including an immersion lens with a middle electrode as an objective lens;

a deflector system for deflecting the particle beam;

a detector system for documenting secondary and/or backscattered particles triggered at a specimen by the particle beam, said detector system being disposed within said immersion lens;

a third lens system being composed of at least four multipole elements and disposed in a path of the particle beam between said first leans system and said immersion lens;

a particle accelerating electrode included in said particle beam device;

said immersion lens of said second lens system including a source side electrode; and means for establishing a potential at said source side electrode substantially at the same as a potential at said particle accelerating electrode.

12. A particle beam device as claimed in claim 11, wherein said multi-pole elements are eight pole elements.

13. A particle beam device as claimed in claim 11, wherein said multi-pole elements are twelve pole elements.

14. A particle beam device as claimed in claim 11, wherein said third lens system is composed of five multi-pole elements.

15. A particle beam device as claimed in claim 14, wherein said multi-pole elements are eight pole elements.

16. A particle beam device as claimed in claim 14, wherein said multi-pole elements are twelve pole elements.

17. A particle beam device as claimed in claim 11, wherein said deflecting unit is disposed in a path of the particle beam between said second, electrostatic, lens system and said third lens system.

18. A particle beam device as claimed in claim 11, wherein said immersion lens of said second, electrostatic, lens system includes a source side electrode, said deflection system being integrated into said source side electrode.

19. A particle beam device as claimed in claim 11, wherein said first lens system includes at least one magnetic lens.

20. An electrostatic detector objective for focusing a primary particle beam guided along a beam axis onto a specimen, comprising:

an immersion lens including a middle electrode and a detector, said middle electrode and said detector being disposed within said immersion lens and concentric relative to the beam axis for documenting secondary and/or backscattered particles;

a specimen side electrode formed as a truncated cone; and said middle electrode being formed as a truncated cone.

21. An electrostatic detector objective for a particle beam apparatus wherein the particle beam apparatus has a primary particle beam directed along a beam axis toward a specimen, a particle accelerating electrode and means for providing a potential at said particle accelerating electrode, comprising:

an immersion lens including a source side electrode and a middle electrode and a specimen side electrode;

means for establishing a potential at said source side electrode that is substantially the same as a potential at said particle accelerating electrode;

means for providing a second potential at said middle electrode;

means for providing a third potential at said specimen side electrode, said second and third potentials being such that primary particles in said primary particle beam are slowed down from a first energy level to a second energy level; and a detector being disposed within said immersion lens and concentric relative to the beam axis for documenting secondary and/or backscattered particles.

* * * * *